(12) United States Patent
Cooper et al.

(10) Patent No.: US 8,035,112 B1
(45) Date of Patent: Oct. 11, 2011

(54) SIC POWER DMOSFET WITH SELF-ALIGNED SOURCE CONTACT

(75) Inventors: James A. Cooper, West Lafayette, IN (US); Asmita Saha, Hillsboro, OR (US)

(73) Assignee: Purdue Research Foundation, West Lafayette, IN (US)

( * ) Notice: Subject to any disclaimer, the term of this patent is extended or adjusted under 35 U.S.C. 154(b) by 91 days.

(21) Appl. No.: 12/429,176

(22) Filed: Apr. 23, 2009

Related U.S. Application Data

(60) Provisional application No. 61/047,274, filed on Apr. 23, 2008.

(51) Int. Cl.
*H01L 21/0312* (2006.01)

(52) U.S. Cl. ............................ 257/77; 257/76; 438/142

(58) Field of Classification Search .................... 257/76, 257/77, E21.065; 438/105, 142
See application file for complete search history.

(56) References Cited

U.S. PATENT DOCUMENTS

| | | | |
|---|---|---|---|
| 4,070,690 A | 1/1978 | Wickstrom | |
| 4,893,160 A | 1/1990 | Blanchard | |
| 5,506,421 A | 4/1996 | Palmour | |
| 5,637,898 A | 6/1997 | Baliga | |
| 5,780,324 A | 7/1998 | Tokura et al. | |
| 5,786,251 A | 7/1998 | Harris et al. | |
| 5,801,417 A | 9/1998 | Tsang et al. | |
| 5,814,859 A | 9/1998 | Ghezzo et al. | |
| 6,054,752 A | 4/2000 | Hara et al. | |
| 6,150,671 A | 11/2000 | Harris et al. | |
| 6,180,958 B1 | 1/2001 | Cooper | |
| 6,238,980 B1 | 5/2001 | Ueno | |
| 6,297,100 B1 | 10/2001 | Kumar et al. | |
| 6,316,806 B1 | 11/2001 | Mo | |
| 6,344,663 B1 | 2/2002 | Slater et al. | |
| 6,362,495 B1 | 3/2002 | Schoen et al. | |
| 6,465,807 B1 | 10/2002 | Ueno | |
| 6,573,534 B1 * | 6/2003 | Kumar et al. | 257/77 |
| 6,737,677 B2 | 5/2004 | Shimoida et al. | |
| 6,815,293 B2 * | 11/2004 | Disney et al. | 438/268 |
| 6,894,319 B2 | 5/2005 | Kobayashi et al. | |
| 7,074,643 B2 | 7/2006 | Ryu | |
| 7,498,633 B2 | 3/2009 | Cooper et al. | |
| 7,521,731 B2 * | 4/2009 | Shimoida et al. | 257/183 |
| 7,622,741 B2 * | 11/2009 | Miura | 257/77 |
| 2003/0073270 A1 * | 4/2003 | Hisada et al. | 438/197 |
| 2004/0145011 A1 | 7/2004 | Hsu et al. | |
| 2006/0065925 A1 | 3/2006 | Yoshida | |
| 2007/0269968 A1 | 11/2007 | Saxler et al. | |

OTHER PUBLICATIONS

U.S. Appl. No. 10/821,613, filed Apr. 9, 2004, Cooper et al.
U.S. Appl. No. 12/429,153, filed Apr. 23, 2009, Cooper et al.
B. Jayant Baliga, "Power Semiconductor Devices," PWS Publishing Co., 1996, Ch. 7, "Power MOSFET," pp. 335-421.

(Continued)

*Primary Examiner* — Phuc Dang
(74) *Attorney, Agent, or Firm* — William F. Bahret; R. Randall Frisk

(57) ABSTRACT

An intermediate product in the fabrication of a MOSFET, including a silicon carbide wafer having a substrate and a drift layer on said substrate, said drift layer having a plurality of source regions formed adjacent an upper surface thereof; a first oxide layer on said upper surface of said drift layer; a plurality of polysilicon gates above said first oxide layer, said plurality of polysilicon gates including a first gate adjacent a first of said source regions; an oxide layer over said first source region of greater thickness than said first oxide layer; and, an oxide layer over said first gate of substantially greater thickness than said oxide layer over said first source region.

16 Claims, 5 Drawing Sheets

OTHER PUBLICATIONS

M. Matin, et al., "A Self-Aligned Process for High Voltage, Short-Channel Vertical DMOSFETs in 4H-SiC," *IEEE Transactions on Electron Devices*, vol. 51, No. 10, Oct. 2004, pp. 1721-1725.

J. Shenoy et al., "High-Voltage Double-Implanted Power MOSFET's in 6H-SiC," *IEEE Electron Device Letters*, vol. 18, No. 3, Mar. 1997, pp. 93-95.

J.A. Cooper et al., "Status and Prospects for SiC Power MOSFETs," *IEEE Transactions on Electron Devices*, vol. 49, No. 4, Apr. 2002, pp. 658-664.

A. Saha et al., "A 1-kV 4H-SiC Power DMOSFET Optimized for Low On-Resistance," *IEEE Transactions on Electron Devices*, vol. 54, No. 10, Oct. 2007, pp. 2786-2791.

G.Y. Chung et al., "Effect of Nitric Oxide Annealing on the Interface Trap Densities Near the Band Edges in 4H-SiC," *Meeting of The American Physical Society*, Mar. 20-24, 2000, Minneapolis, MN (4 pages).

A. Saha et al., "Optimum Design of Short-Channel 4H-SiC Power DMSOFETs," *Materials Science Forum*, vols. 527-529, 2006, pp. 1269-1272.

\* cited by examiner

SIC POWER DMOSFET WITH SELF-ALIGNED SOURCE CONTACT

CROSS-REFERENCE TO RELATED APPLICATION

This application claims the benefit of U.S. Provisional Patent Application Ser. No. 61/047,274, filed Apr. 23, 2008, which application is hereby incorporated by reference.

GOVERNMENT RIGHTS

This invention was made with government support under Contract/Grant No. W56HZV-06-C-0228 awarded by the U.S. Army TACOM LCMC, and Contract/Grant No. N00014-05-1-0437 awarded by DARPA. The government has certain rights in the invention.

BACKGROUND OF THE INVENTION

This invention relates generally to semiconductor field effect transistors, and more particularly to field effect transistors having self-aligned source contacts.

The metal oxide semiconductor field effect transistor (MOSFET) is a device used to amplify or switch electronic signals. Power MOSFETs are well known for their ability to carry large currents in the on-state while withstanding large breakdown voltages in the off-state. In such devices, current flow between source and drain regions in a semiconductor substrate is controlled by a voltage applied to a gate electrode that is separated from the semiconductor surface by an insulator, typically silicon dioxide. In an n-type enhancement MOSFET, for example, a positive bias on the gate causes a surface inversion layer—or channel—to form in a p-type region under the gate oxide and thereby creates a conductive path between source and drain. The application of a positive drain voltage then produces current flow between drain and source. Lateral and vertical power MOSFET structures in silicon have been explored over the years, the former type having the drain, gate and source terminals on the same surface of the silicon wafer, the latter type having the source and drain on opposite surfaces of the wafer. Several different types of vertical power MOSFETs have been proposed, including the double-diffused MOSFET (DMOSFET) and the trench-gate or UMOSFET. These and other power MOSFETs are described in a textbook by B. Jayant Baliga entitled Power Semiconductor Devices, PWS Publishing Co. (1996), the disclosure of, which is hereby incorporated herein by reference.

Although silicon has been the material of choice for many semiconductor applications, its fundamental electronic structure and characteristics prevent its utilization beyond certain parameters. Thus, interest in power MOSFET devices has turned from silicon to other materials, including silicon carbide. SiC power switching devices have significant advantages over silicon devices, including faster switching speed, lower specific on-resistance and thus lower power losses. SiC has a breakdown electric field that is an order of magnitude higher than that of silicon, which allows for a thinner drift region and thus a lower drift region resistance.

In power DMOSFETs, an important performance parameter is the specific on-resistance ($R_{ON,SP}$), which is defined as the product of the resistance when the device is in the "on", or highly conducting, state (low $V_{DS}$), times the area of the device (units are $\Omega\text{-cm}^2$ or $m\Omega\text{-cm}^2$). Thus it is important to minimize both the resistance and the area of the device. For DMOSFETs in the blocking voltage regime of below about 600-1800V, a significant component of the total resistance is the resistance of the source contacts. Larger-area source contacts obviously have lower resistance, but increasing the contact area increases the total area of the device, and hence $R_{ON,SP}$. It is important to find ways to reduce the source contact resistance without increasing the area of the device.

In a conventional DMOSFET, the source contact is defined by photolithography, and the source contact must be separated from the edge of the gate by sufficient distance so that the source contact and gate cannot touch even under worst-case misalignment of the source contact mask. In addition, the actual functional area of the source contact is determined by the overlap of the source contact metal and the N+ implant that forms the source region in the semiconductor. Since the N+ implant is defined by a separate mask, relative misalignment of the source contact mask and the N+ implant mask can reduce the functional area of the source contact, thereby increasing source resistance and degrading performance.

It is desired to produce DMOSFETs and related devices wherein misalignments of source contact and gate are reduced or eliminated.

SUMMARY OF THE INVENTION

The present invention provides high voltage power MOSFETs, with self-aligned source contacts and a method for making the same.

An intermediate product in the fabrication of a MOSFET, including a silicon carbide wafer having a substrate and a drift layer on said substrate, said drift layer having a plurality of source regions formed adjacent an upper surface thereof; a first oxide layer on said upper surface of said drift layer; a plurality of polysilicon gates above said first oxide layer, said plurality of polysilicon gates including a first gate adjacent a first of said source regions; an oxide layer over said first source region of greater thickness than said first oxide layer; and, an oxide layer over said first gate of substantially greater thickness than said oxide layer over said first source region.

These and other aspects and advantages of the present invention will become more apparent upon reading the following detailed description of preferred embodiments in conjunction with the accompanying drawings.

DESCRIPTION OF PREFERRED EMBODIMENTS

Figure 1:
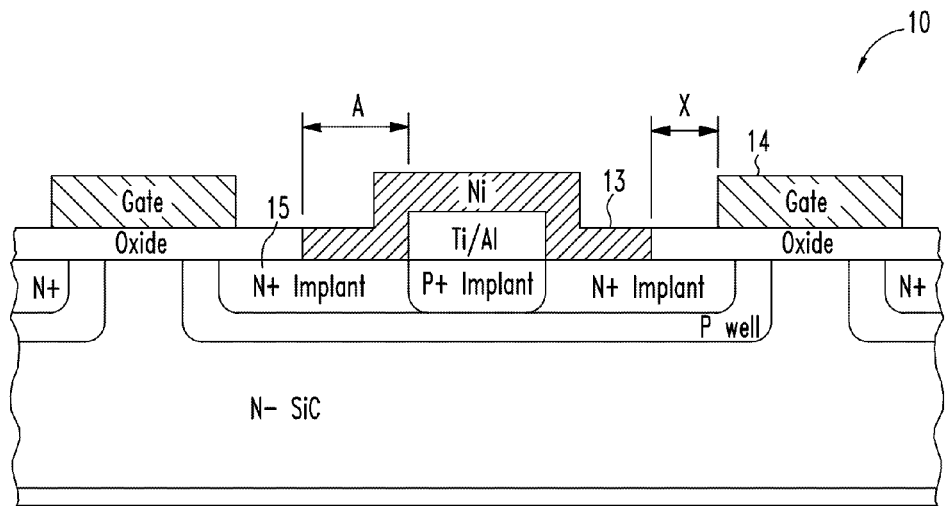
FIG. 1 is a side, cross-sectional view of one cell region 10 of a perfectly aligned, conventional DMOSFET 11.

For the purpose of promoting an understanding of the principles of the invention, reference will now be made to the embodiments illustrated in the drawings and specific language will be used to describe the same. It will nevertheless be understood that no limitation of the scope of the invention is thereby intended, and that alterations and further modifications in the illustrated device and further applications of the principles of the invention as illustrated therein are contemplated as would normally occur to one skilled in the art to which the invention relates. As shown in the Figures, the sizes of some layers or regions are exaggerated to better illustrate the general structures of the present invention, and actual sizes—often with thicknesses of 50 nm—are either specified or are understood by persons of skill in the art to be other than that shown in the Figures.

It is desired in power DMOSFETs to have a low specific on-resistance ($R_{ON,SP}$), which is defined as the product of the resistance when the device is in the "on", or highly conducting, state (low $V_{DS}$), times the area of the device (units are $\Omega\text{-cm}^2$ or $m\Omega\text{-cm}^2$). It is therefore important to minimize both the resistance and the area of the device. For DMOSFETs with blocking voltage below about 1800V, a significant component of the total resistance is the resistance of the source contacts. While larger-area source contacts obviously have lower resistance, they conversely increase the total area of the device, and hence $R_{ON,SP}$.

Figure 2:
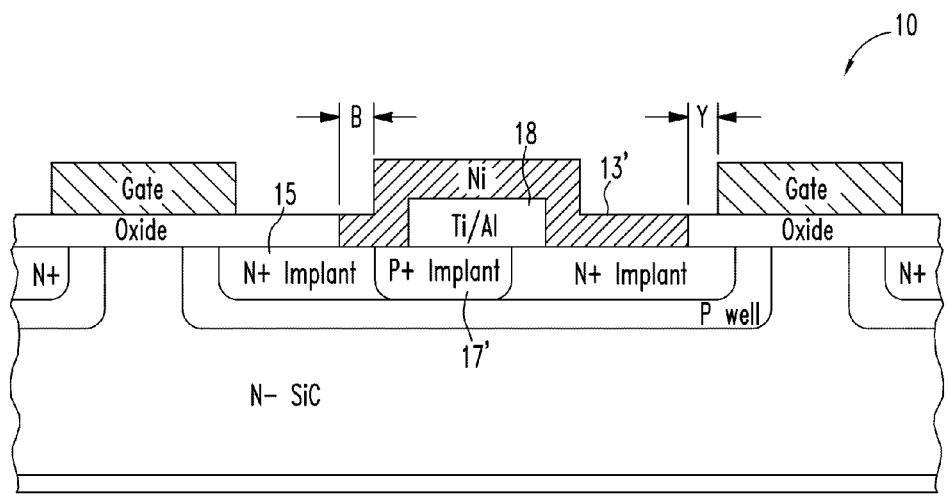
FIG. 2 is a side, cross-sectional view of the one cell region 10 of FIG. 1 in a worst-case mask misaligned fabrication.

Referring to FIG. 1, there is shown one cell region 10 of a perfectly aligned, conventional DMOSFET 11. In DMOSFET 11, the source contact 13 is defined by photolithography, and source contact 13 must be separated from the edge of the gate 14 by sufficient distance X so that source contact 13 and gate 14 cannot touch even under worst-case misalignment of the source contact mask. In addition, the actual functional area of the source contact is determined by the overlap A of the source contact metal 13 and the N+ implant 15 that forms the source region in the semiconductor. Since the N+ implant 15 is defined by a separate mask, relative misalignment of the source contact mask and the N+ implant mask can reduce the functional area of the source contact, thereby increasing source resistance and degrading performance. A worst-case mask misaligned is shown in FIG. 2 where the Ni metal for the source contact 13' has been misaligned to the right and the P+ implant 17 for the P+ base contact 18 has been misaligned to the left. The resulting overlap B of Ni metal and N+ implant has been reduced almost to zero, resulting in a very large contact resistance for this part of the device. Another drawback of this approach is the alignment tolerance (spacing X) that must be built into the MOSFET design to ensure that the source metal 13 never comes into contact with gate 14 under worst-case misalignment. That is, if the MOSFET design parameters require that source metal 13 never gets closer to gate 14 than spacing Y, even under a worst-case mask misalignment (as shown in FIG. 2), then the target mask alignment must be performed with a spacing X. The necessary additional spacing (which is the difference between X and Y) unduly increases the area of the cell, and thus increases RON, SP. Both these problems—increased contact resistance at reduced area overlap B from mask misalignment and increased cell width to ensure adequate spacing Y—are eliminated in the present invention by negating the opportunity for misalignment of source contact metal and gate.

Figure 3:
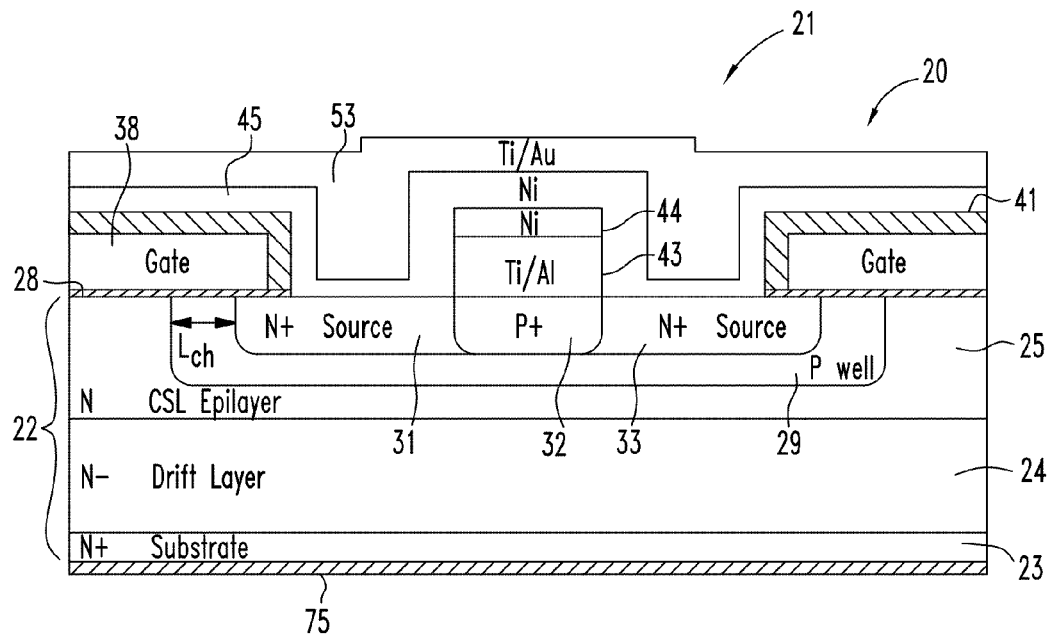
FIG. 3 is a side, cross-sectional view of one cell region 20 of a DMOSFET 21 in accordance with the present invention.

Referring to FIG. 3, there is shown one cell region 20 of a double-diffused, power metal-oxide-semiconductor field effect transistor (DMOSFET) 21 in accordance with the present invention. While this and other embodiments presented herein are directed to power DMOSFETs and method for making the same, the present invention is believed to be applicable in varying degrees to other MOSFET designs or similar semiconductor geometry having a source and a gate where it is desirable to place the source and gate as close together as possible and/or to minimize or reduce mask misalignment errors relating to positioning of the gate and source. Such other MOSFETs contemplated by the present invention include, but are not limited to, other vertical MOSFETs, e.g., VMOSFETs and UMOSFETs, as well as lateral DMOSFETs.

DMOSFET 21 includes a substrate 23 and a number of semiconductor layers and implants formed on or in the substrate 23 up through top surface 28, collectively referred to as the substrate body 22. The fabrication of substrate body 22, and variations thereof, can be accomplished in a variety of ways well known in the art and not substantially discussed herein. Substrate 23 and the layers and implants are formed from silicon-carbide and doped with N-type or P-type impurities as shown in FIG. 3 and described herein. In addition to the embodiments described, alternative embodiments are contemplated wherein the compositions and configurations of the layers and implants, of the impurity concentrations, and of the method and timing of impurity doping and implant creation differs from that described herein and is in any manner suitable for the intended MOSFET task. Substrate 23 is heavily doped with N-type impurities to an "N+" concentration. Formed atop substrate 23 is drift layer 24, which is lightly doped to an "N−" concentration. Atop drift layer 24 is formed a current spreading epilayer (CSL) 25, which is more heavily doped than drift layer 24, but not as heavily doped as substrate 23. Alternative embodiments are contemplated wherein there is no separately formed CSL layer, and the drift layer 24 extends all the way to the top SiC surface 28. Formed in the top of the current spreading layer 25 is a P well 29. The conductivity types may alternatively be the opposite of those described above. That is, both n-channel and p-channel devices are contemplated as part of the present invention.

Figure 10:
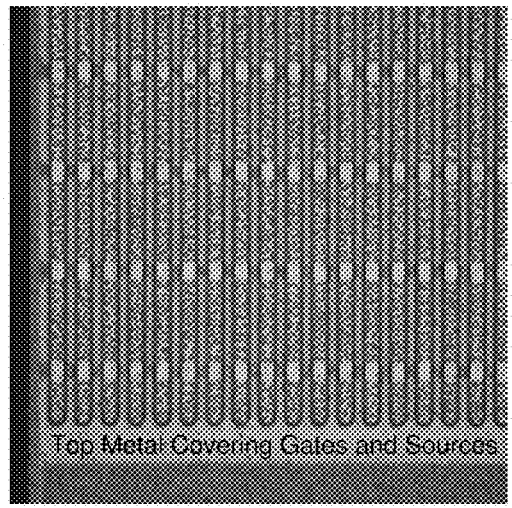
FIG. 10 is a wafer photograph showing gate and source fingers of the DMOSFET OF FIG. 9 in more detail.

It should be understood that the semiconductor device (MOSFET 21) of FIG. 3 may be a single "transistor cell" and that a completely fabricated transistor device may include any number of such semiconductor devices or cells. As such, the present description relating to cell region 20 is with the understanding that the description is applicable to all semiconductor devices that form a larger, fabricated transistor device. For example, the fabricated transistor device may include any number of doped semiconductor wells 29 depending on the number of semiconductor cell regions 20 included therein. In addition, the present embodiment is directed to an interdigitated finger array (as shown in FIG. 10 and described herein), but alternative embodiments are contemplated wherein the number, alignment and interconnection of cell regions 20 may be arranged in a hexagonal cellular array, sometimes referred to as a HEXFET.

Formed within P well 29 are two heavily doped N+ implant source regions 31 and 32 on opposing sides of a heavily doped, central implant P+ base 33, as shown. N+ implant source regions 31 and 32 are heavily doped with N-type impurities to an "N+" concentration, and P+ base 33 is heavily doped with P-type impurities to an "P+" concentration. N+ implants 31 and 32 comprise the two sources of the cell region 20 of MOSFET 21, and P+ base 33 provides ohmic contact to P well 29. The upper surfaces of P+ base 33, of N+ implants 31 and 32, of P well 29 and of CSL epilayer 25 (or of drift layer 24 if there is no separate CSL epilayer 25) are coplanar and together form the upper surface 28 of substrate body 22.

Figure 4:
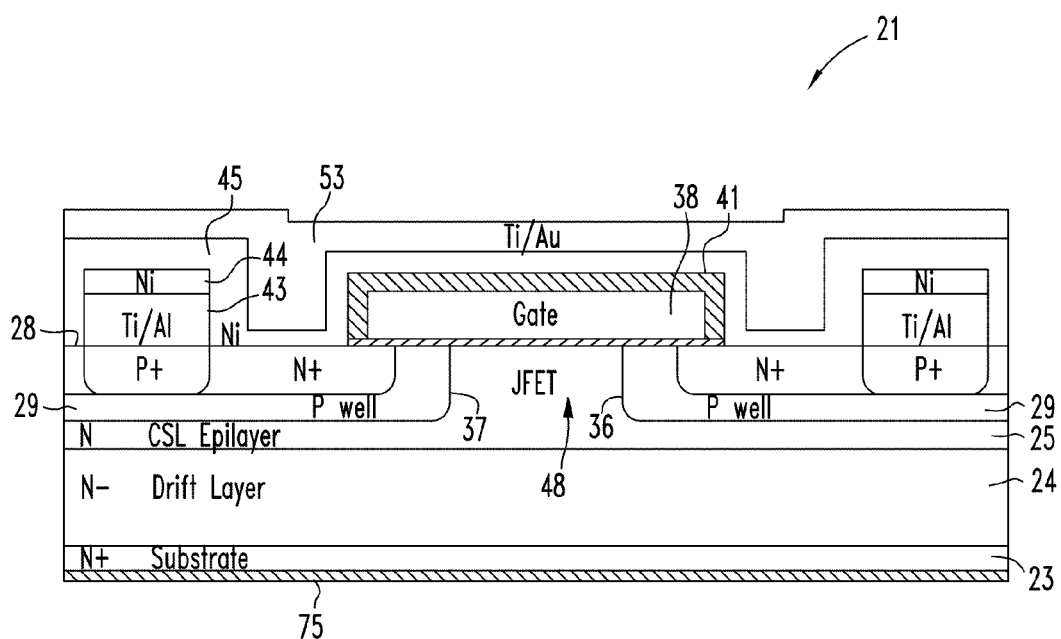
FIG. 4 is a side, cross-sectional view of the cell region 20 of FIG. 3 and shown shifted one half cell width laterally from the view of FIG. 3.

Referring to FIGS. 3 and 4, FIG. 4 is a view of MOSFET 21 shifted one half cell width laterally from the view of FIG. 3. Formed atop upper substrate surface 28 and centered over the left end 36 of one P well 29 and the right end 37 of an immediately adjacent P well 29 is a polycrystalline silicon (polysilicon) gate 38 that is surrounded along its top, bottom, left and right sides by an insulating layer of silicon dioxide 41. Formed atop P+ base 33 is a Ti/Al contact metal 43, and a Ni contact metal 44 is formed atop Ti/Al contact metal 43. An Ni ohmic contact metal 45 is formed over the entire MOSFET 21, overlapping the polysilicon gate 38, but insulated from it by the thick oxide layer 41 on the top and sides thereof.

Because gate 38 is completely surrounded by insulating oxide layer 41, its positioning relative to source contacts 31 and 32 is much less critical, and it cannot detrimentally come in contact with any portion of the Ni metal contact 45 due to any mask misalignment during processing. Gate 38 is centered over the JFET region 48 defined in CSL epilayer 25 between the facing ends 36 and 37 of adjacent P wells 29. Ni ohmic contact metal 45 extends over and contacts with the MOSFET 21 sources (N+ implants) 31 and 32, as well as Ti/Al and Ni metals 43 and 44, respectively. Once gate 38 and Ti/Al and Ni metals are formed atop surface 28, the deposition of Ni metal contact 45 over the entire MOSFET 21 (which is later followed by selective etching to expose and access one portion of commonly connected gates 38) makes conformal, direct and self-aligning contact with the Ti/Al and Ni metals 43 and 44 and, most importantly, with N-source implants 31 and 32. A Ti/Au layer 53 is then formed atop Ni metal contact 45, and thus over all of Ni metal contact 45.

Figure 5:
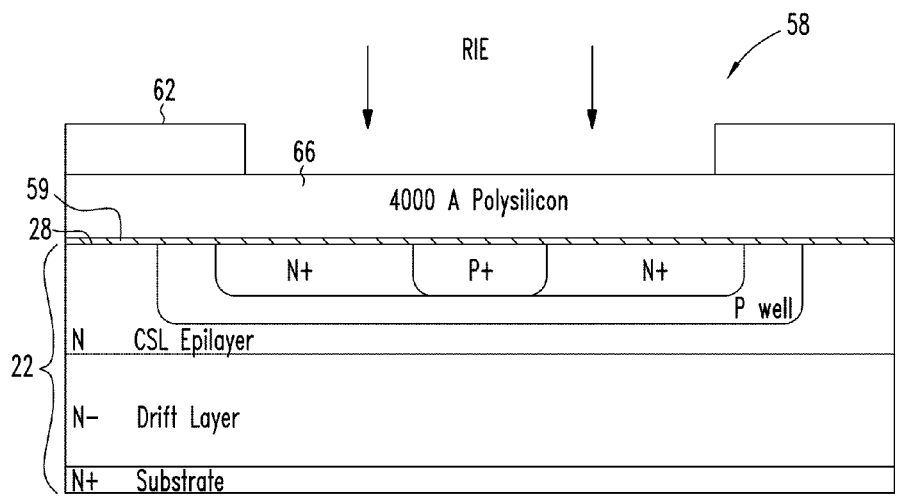
FIGS. 5-8 are side, cross-sectional views of one cell region of an intermediate semiconductor product 58 showing various intermediate stages of fabrication of the DMOSFET 21 of FIG. 3.

Referring to FIG. 5, MOSFET 21 is there shown as an intermediate semiconductor product 58 with all substrate, layers and doping fabricated up through top SiC surface 28 (which together constitute substrate body 22), an oxidation layer 59, a 4000 Å thick layer 66 of polysilicon formed across oxidation layer 59, and application of gate mask 62 atop polysilicon layer 66 in preparation for etching away a portion of polysilicon layer 66 to create gates 38. The fabrication of intermediate semiconductor product 58, as shown in FIG. 5, can be accomplished in a variety of ways well known in the art. In one embodiment, six quarter wafers were processed to produce DMOSFETs in accordance with the present invention, the processing sequence for which is summarized in Appendix I. A detailed run sheet (including materials, temperatures, pressures, times, and chemicals), with slight modifications to the sequence in Appendix I, is provided in Appendix II. The method set forth in Appendix I (through step "m") and Appendix II (through step 15 and into step 16) represents one method, with some alternative processing steps, for fabricating the intermediate semiconductor product 58 of FIG. 5.

Figure 6:
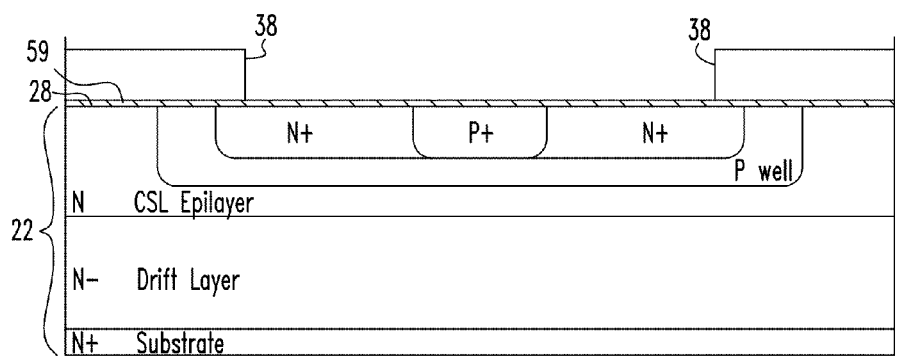

These steps to fabricate intermediate semiconductor product 58 include growing the 50 nm thick silicon lower gate oxide layer 59 on top of the entire surface 28 of the SiC substrate body 22 by thermal oxidation in a pyrogenic oxidation system at 1150° C. for 2.5 hours. This is followed by deposition of a 4000 Å (or alternatively 5000 A, as indicated in Appendix II) layer of polysilicon 66 atop oxide layer 59. Application of gate mask 62 atop the polysilicon slab 66, followed by RIE (Reactive Ion Etch) (Step "m" of Appendix I and step 16a (the third a) of Appendix II) removes the polysilicon within the mask outline and down to the gate oxidation layer 59, thus creating gates 38. Removal of the gate mask reveals the intermediate semiconductor product 58a shown in FIG. 6.

The next procedures include applying ohmic contacts to the source and P+ base and taking advantage of the fact that polysilicon forms a much thicker $SiO_2$ layer than does SiC when thermally oxidized at temperatures in the 850-1000° C. range. The $SiO_2$ is then removed over the SiC by a short oxide etch, without using a photomask to define the area where the oxide is removed and expose the N+ implants 31 and 32 and the P+ base 33. Because it is much thicker, the oxide over the polysilicon gate is not completely removed during this process and forms an insulating layer over and around the polysilicon gate 38. DMOSFET 21 may include the use of a segmented P+ contact to the P+ base, as described U.S. Pat. No. 7,498,633, which is hereby incorporated by reference herein, and as already demonstrated experimentally (see, for example, A. Saha and J. A. Cooper, "A 1200V 4H—SiC Power DMOSFET with Ultra-low On-Resistance," IEEE Transactions on Electron Devices, 54, 2786-2791, October 2007 and A. Saha and J. A. Cooper, "Optimum Design of Short-Channel 4H—SiC Power DMOSFETs," Materials Science Forum, 527-529, 1269-1272, 2006, both of which are hereby incorporated by reference herein). Because the P+ contact only occurs in certain spots along the length of the source fingers, typically occupying around 10-15% of the finger length, the vast majority of the source fingers have no P+ contact, and the full area is available for use as N+ source contact.

Figure 7:
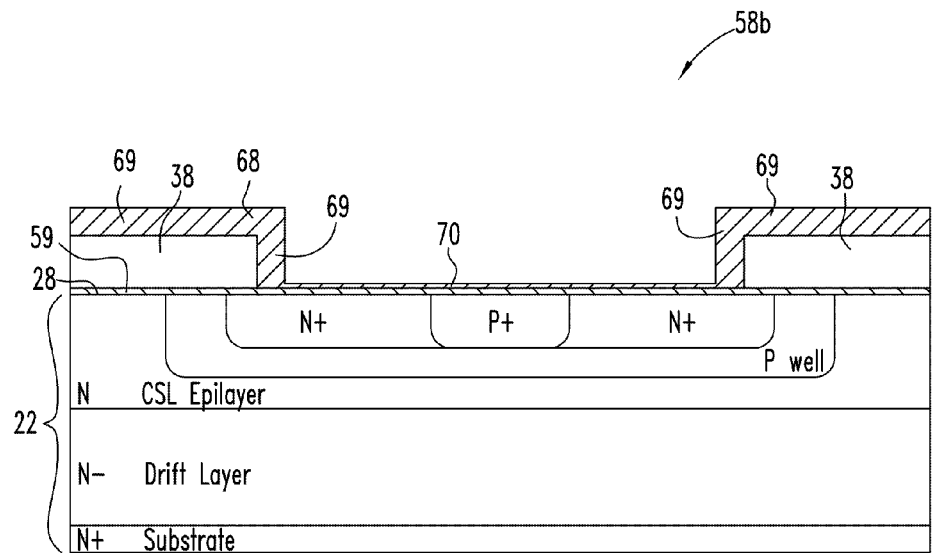
Figure 8:
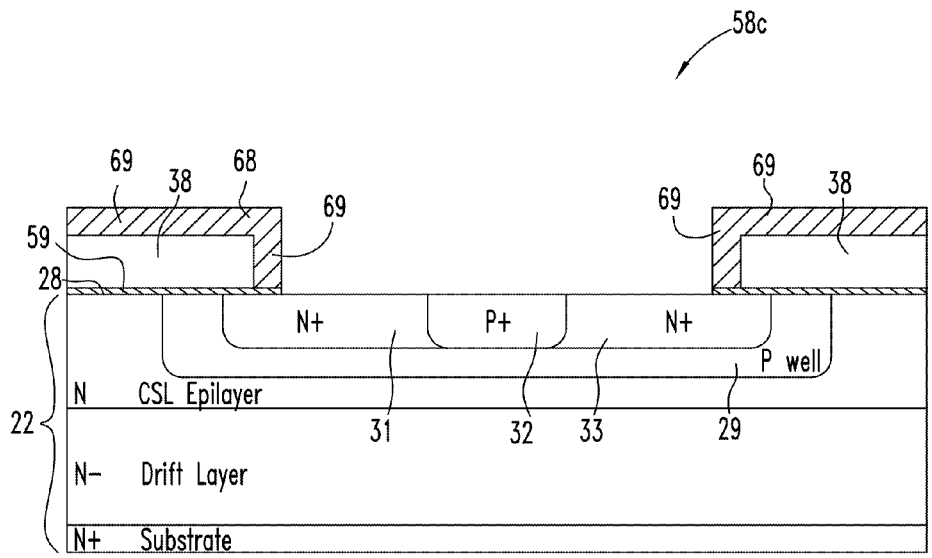

Referring to FIG. 7, after the ion etch creates gates 38, an oxidation layer 68 is grown over the entire upper surface of intermediate semiconductor product 58a (Appendix II, step 16, the third step "d": Dry oxidation for 6 hrs. at 1000 C in tube 7, then wet oxidation for 4.5 hrs at 950 C and then dry oxidation for 2 hrs at 950 C) to produce intermediate semiconductor product 58b. Oxidation layer 59 grown from the SiC surface 28 is about 50 nm thick. The foregoing oxidation growing step 16d grows oxidation on the polysilicon gates 38 about ten times faster or more than on the SiC substrate (on which there is already about a 50 nm oxidation layer 59). Consequently, oxidation layer 68 on top and on the sides of each gate 38 has grown to about 500 nm thick (at 69), while only about 10 nm or less of oxidation are added to upper substrate surface 28 (at 70). It is also noted that formation of the roughly 50 nm lower gate oxidation layer 59 was conducted at a temperature of about 1150° C. for several hours—a slow oxidation. The later oxidation of both the polysilicon gates 38 and SiC substrate was conducted at lower temperatures—dry oxidation at 1000° C. for 6 hrs., wet oxidation at 950° C. for 4.5 hrs., and then dry oxidation for 2 hrs. at 950° C. The SiC only grew another 10 nm or less compared to the roughly 500 nm oxide growth on the polysilicon gate 38. At this stage then, oxide layer 68 is about 500 nm thick on the top and sides of gates 38, but only about 60 nm thick or less on the SiC substrate therebetween. A short oxide etch is then applied long enough to completely remove the thin oxide layer (comprising previously formed layers 59 and 70) over substrate surface 28 and between gates 38, which exposes N+ and P+ implants 31, 32 and 33 and thus still leaves a very thick insulating oxide layer 69 on the top and sides of gates 38. The resulting intermediate semiconductor product 58c is shown in FIG. 8. Ohmic contact to P well 29 is then provided by creating Ti/Al and Ni contact metals 43 and 44, respectively, via E-beam evaporation of Ti/Al/Ni (to thicknesses of 100 A/500 A/200 A, respectively) to the now exposed P+ contact 33, as shown in FIG. 3.

A thickness of Ni contact metal 45 is then deposited, without masking, over the entire surface of intermediate semiconductor product 58c via E-beam evaporation, which creates a conformal Ni layer in ohmic contact with N+ source implants 31 and 32 and with the just deposited Ti/Al/Ni contact metals 43 and 44. The thick insulating layer of $SiO_2$ electrically insulates polysilicon gates 38 from Ni contact metal 45. Note that the area of the functional source contact is not determined by the alignment of any masking levels and is not subject to random misalignments during processing. Instead, it is totally determined by the spacing between adjacent polysilicon gates and is, in fact, self-aligned to the gate level, being separated by the thickness of the oxide layer covering the gate. This eliminates the alignment tolerance (X or Y in FIGS. 1 and 2), thus reducing the cell area and the specific on-resistance.

Final steps include E-beam evaporation of a 2000 Å Ni metal contact layer 75 on the backside of the intermediate semiconductor product 58, a contact anneal to activate the P- and N-type contacts, and E-beam evaporation of a Ti/Al layer (at thicknesses of 150 Å/7000 Å, respectively) over the entire semiconductor product 58, which then constitutes the finished DMOSFET 21. The contact anneal forms an alloy between the Ni metal 45 and N+ source implants 31 and 32 and between the Ti/Al metal 43 and P+ implant, upon which step they become "ohmic". The Ti/Au metal top layer 53 provides a lower contact resistance than would the subjacent Ni metal layer.

The primary processing steps described herein are accompanied by numerous secondary steps (such as "RCA clean (right before gate oxidation)" and "DI rinse: 6 times"), all of which are listed recited in Appendix II. Alternative embodiments are contemplated wherein the secondary steps (and even certain of the primary steps) can be performed in ways other than recited, with materials, solutions and concentrations other than recited, and for times and under temperatures and conditions other than recited, so long as the gate and substrate source (or other ohmic contact materials) react to form, create or grow an insulation layer (such as $SiO_2$) sufficiently faster, larger and/or with more insulating capacity at the gate surface than at the substrate surface and that will therefore be uniformly removable at a rate which will remove all such formed, created or grown layer substantially or entirely completely from the substrate surface and leave a sufficiently insulative layer around the gate.

Figure 9:
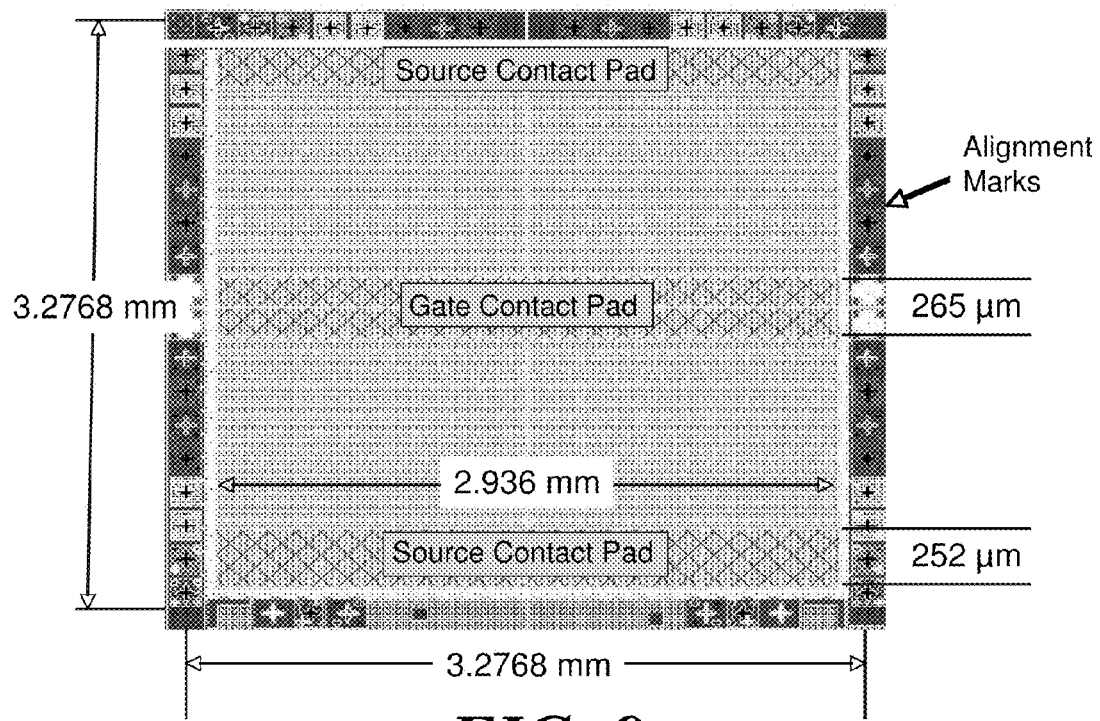
FIG. 9 is a layout view of a 10 A DMOSFET formed in accordance with the present invention.

FIG. 9 shows the layout of a 10 A DMOSFET having an active area of 0.06 cm2. For this device, a current of 10 A would correspond to a current density of 167 A/cm2. The FET consists of a top half and a bottom half. The bonding pad for the polysilicon gate runs horizontally across the center of the chip, and polysilicon fingers run upward and downward from this pad. Source bonding pads run horizontally along the top and bottom, and Ni source fingers run downward from the top pad and upward from the bottom pad. The source fingers are interdigitated between gate fingers. The active areas between bonding pads are covered with top metal that connects with the source bonding pads (metal not shown). The alignment marks along the periphery of the chip constitute the saw-apart grid, and are destroyed when the die are sawed apart for packaging. The center-to-center spacing between adjacent die is 3.2768 mm.

Examples of such a DMOSFET have been made using Cree wafer JG0186-13, with an 18 mΩ-cm n-type 4H—SiC substrate, an 8.43 μm drift epilayer doped 9.31×1015 cm-3, and a 0.90 μm n-type CSL epilayer doped 9.85×1016 cm-3, and using Cree wafer JG0186-12, with an 18 mΩ-cm n-type 4H—SiC substrate, an 8.439 μm drift epilayer doped 9.55× 1015 cm-3, and a 0.90 μm n-type CSL epilayer doped 1.0× 1017 cm-3. FIG. 10 is a wafer photograph showing the gate and source fingers in more detail.

The gate dielectric described above may be used in conjunction with a short-channel DMOSFET structure, with channel lengths of 0.5 μm or less, such as described in the following paper and patent application, which are hereby incorporated by reference: M. Matin, A. Saha, and J. A. Cooper, Jr., "A Self-Aligned Process for High Voltage, Short-Channel Vertical DMOSFETs in 4H—SiC," IEEE Transactions on Electron Devices, Vol. 51, No. 10, pp. 1721 1725, October, 2004; and patent application Ser. No. 10/821,613, filed Apr. 9, 2004. These references also disclose examples of doping concentrations and other characteristics suitable for a power DMOSFET according to the present invention.

In addition to or instead of such a short-channel structure, a current spreading layer and/or segmented p+ base contacts may be employed, such as described in U.S. Pat. No. 7,498, 633 to Cooper et al., hereby incorporated by reference. The present invention also contemplates various combinations of one or more of such design features with a high-k gate dielectric as disclosed in the U.S. patent application Ser. No. 12/429,153, filed Apr. 23, 2009, entitled Silicon Carbide Power MOSFET With Improved Gate Dielectric, filed in the names of James A. Cooper and Peide Ye.

While the invention has been illustrated and described in detail in the drawings and foregoing description, the same is to be considered as illustrative and not restrictive in character, it being understood that only preferred embodiments have been shown and described and that all changes and modifications that come within the spirit of the invention are desired to be protected.

We claim:

1. A silicon carbide power MOSFET, comprising:
a silicon carbide wafer having a substrate and a drift layer on said substrate, said drift layer having a plurality of source regions formed adjacent an upper surface thereof;
a plurality of polysilicon gates above said drift layer, said plurality of polysilicon gates including a first gate adjacent a first of said source regions, said first gate having a top surface, a lower surface and a sidewall, said sidewall overlying said first source region;
a first oxide layer between said first gate lower surface and said upper surface of said drift layer;
a second, thicker oxide layer over said top surface and sidewall of said first gate; and
a conformal layer of metal extending laterally across said first gate top surface and sidewall and said adjacent first source region.

2. A silicon carbide MOSFET structure, comprising:
a silicon carbide wafer having a substrate body having a source region formed adjacent an upper surface thereof;
first and second oxide layers on said upper surface adjacent said source region;
a polysilicon gate above each of said first and second oxide layers;
a gate oxide layer, thicker than said first and second oxide layers beneath said gates, over each of said gates and the sides thereof; and
a metal or oxide layer over said source region, extending between adjacent gate oxide layers.

3. The silicon carbide MOSFET structure of claim 2, wherein said layer over said source region is a conformal layer of metal extending laterally across said gates and said source region.

4. A silicon carbide MOSFET structure, comprising:
a silicon carbide wafer having a substrate body having a source region formed adjacent an upper surface thereof;
first and second oxide layers on said upper surface adjacent said source region;
a polysilicon gate above each of said first and second oxide layers;
a gate oxide layer, thicker than said first and second oxide layers beneath said gates, over each of said gates and the sides thereof;
a metal or oxide layer over said source region, extending between adjacent gate oxide layers; and wherein said layer over said source region is an oxide layer of greater thickness than said first and second oxide layers and substantially less thickness than said gate oxide layers.

5. A silicon carbide MOSFET structure, comprising:

a silicon carbide wafer having a substrate body having a source region formed adjacent an upper surface thereof;

first and second oxide layers on said upper surface adjacent said source region;

a polysilicon gate above each of said first and second oxide layers;

a gate oxide layer, thicker than said first and second oxide layers beneath said gates, over each of said gates and the sides thereof;

a metal or oxide layer over said source region, extending between adjacent gate oxide layers; and wherein said MOSFET structure has a first state in which said layer over said source region is an oxide layer of greater thickness than said first and second oxide layers and substantially less thickness than said gate oxide layers, and a second state in which said layer over said source region is a conformal layer of metal extending laterally across said gates and said source region.

6. A MOSFET structure, comprising:

a silicon carbide wafer having a substrate body with an upper surface, said substrate body having at least one source region formed adjacent said upper surface;

a substrate surface oxidation layer on said upper surface of said substrate body and adjacent said source region;

at least two polysilicon gates above said substrate surface oxidation layer, said gates each having a top, a bottom and sides, wherein a first source region of said at least one source region is juxtaposed between first and second adjacent gates of said at least two polysilicon gates;

a gate oxide layer, thicker than said substrate surface oxidation layer, over said tops and sides of each of said gates; and a material layer over said first source region and between said gate oxide layers on said sides of said gates, said material layer comprising one of an oxide and a metal contact.

7. The MOSFET structure of claim 6, wherein said gate oxide layer is more than eight times thicker than said substrate surface oxidation layer.

8. The MOSFET structure of claim 6, wherein said material layer is a source oxide layer having a thickness greater than that of said substrate surface oxidation layer and less than that of said gate oxide layer.

9. The MOSFET structure of claim 8, wherein said source oxide layer includes a first layer homogeneously formed with and of the same thickness as said substrate surface oxidation layer and a second, separately formed layer homogeneously formed with and of lesser thickness than said gate oxide layer.

10. The MOSFET structure of claim 6, wherein said material layer is a metal contact layer providing external electrical contact with said at least one source region.

11. The MOSFET structure of claim 10 wherein said metal contact layer extends over substantially the entire MOSFET structure except for at least one gate contact access portion, said metal contact layer being in electrical contact with said at least one source region but electrically insulated from said at least two polysilicon gates by at least one of said gate oxide layer and said substrate surface oxidation layer.

12. The MOSFET structure of claim 10, wherein said metal contact layer extends over said gates and covers the space between them, said metal contact layer being in electrical contact with said at least one source region but electrically insulated from said gates by at least one of said gate oxide layer and said substrate surface oxidation layer.

13. The MOSFET structure of claim 6, wherein said substrate body includes a lower, heavily doped substrate and a lightly doped superjacent drift layer.

14. The MOSFET structure of claim 13, wherein said at least one source region is defined in said drift layer.

15. The MOSFET structure of claim 6, wherein said substrate body includes a lower, heavily doped substrate, a lightly doped drift layer superjacent to said substrate, and a current spreading layer (CSL) that is superjacent to said drift layer and that is more heavily doped than said drift layer, but not as heavily doped as said substrate.

16. The MOSFET structure of claim 15, wherein said at least one source region is defined in said current spreading layer (CSL).

* * * * *

UNITED STATES PATENT AND TRADEMARK OFFICE
CERTIFICATE OF CORRECTION

| | |
|---|---|
| PATENT NO. | : 8,035,112 B1 |
| APPLICATION NO. | : 12/429176 |
| DATED | : October 11, 2011 |
| INVENTOR(S) | : Cooper et al. |

It is certified that error appears in the above-identified patent and that said Letters Patent is hereby corrected as shown below:

In column 5, line 66, please change "photomask" to --photomask,--.
In column 8, line 21, please add the attached Appendix I and Appendix II.

Signed and Sealed this
Seventh Day of February, 2012

David J. Kappos
*Director of the United States Patent and Trademark Office*

APPENDIX I:
PICTORIAL DEPICTION OF THE FABRICATION PROCESS

| | |
|---|---|
| 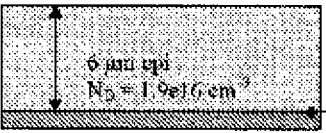<br>a) Starting wafer. | ■ Starting Wafer :<br>4H-SiC, 6 μm N-epilayer with a doping of 1.9e16 cm⁻³.<br>■ Substrate specification: 416 μm thick with a resistivity of 19 mohm-cm, orientation = 8°9'. |
| 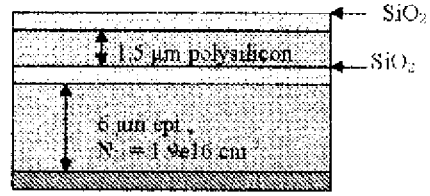<br>b) Wafer cross-section after poly-silicon deposition. | ■ Wet Oxidation @ 1150°C for 90 min, oxide thickness = 300 Å<br>■ Deposition of 1.5 μm polysilicon @ 600°C<br>■ Wet Oxidation @ 900°C for 20 min., oxide thickness = 200 Å |
| 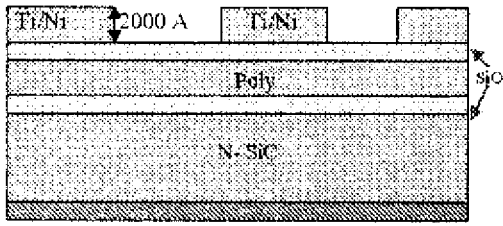<br>c) Wafer cross-section after pwell lithography and Ti/Ni liftoff. | ■ Liftoff lithography using Mask#1 (Pwell Mask)<br>■ E-beam evaporation of Ti(150Å)/1900Å Ni and liftoff |
| 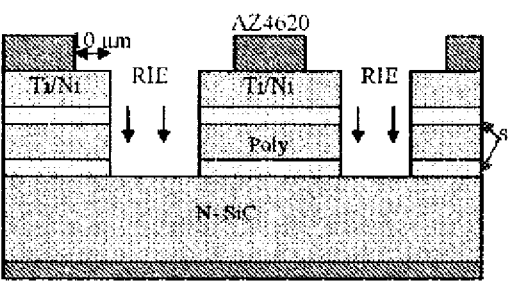<br>d) Patterning of polysilicon using Ti/Ni mask. | ■ Etching lithography using Mask#2 (micro-masking mask), photoresist used : AZ4620<br>■ RIE to pattern polysilicon @ 100 W, 400 volt, using SF₆ @ 10 sccm. It takes 17-18 min. to etch through the polysilicon. This patterned polysilicon acts as a mask for pwell implantation. |

| | |
|---|---|
| 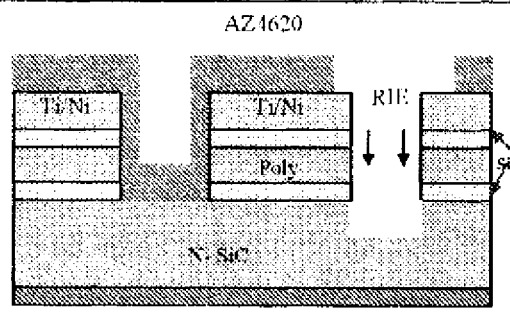<br>e) RIE to create registration marks. | ▪ Etching lithography using Mask # 3 (registration mask), photoresist used : AZ4620.<br>▪ RIE of SiC @100 W, 400 volt, using $SF_6$ @ 20 sccm to create alignment marks. |
| 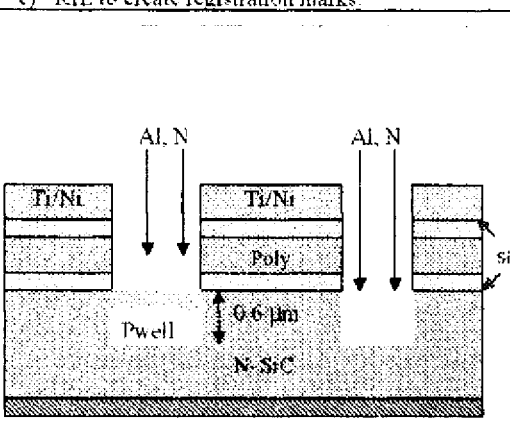<br>e) Implantation of counter-doped pwell. | ▪ Implantation:<br>Pwell (aluminum) :<br>(energy, dose) – (60 keV, $1.6 \times 10^{12}$),(100keV,$2.4 \times 10^{12}$), (260 keV, $2.2 \times 10^{13}$), (360 keV, $6.3 \times 10^{13}$)<br>Counter-doping (nitrogen): (energy, dose) – (30 keV, $4.9 \times 10^{12} \, cm^{-2}$)<br>Implant temperature = $650^\circ$ C. |
| 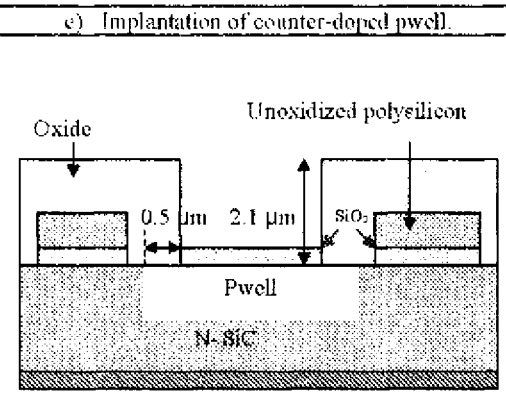<br>f) Oxidation of patterned polysilicon. | ▪ Etch Ti/Ni using piranha (1 $H_2O_2$: 1 $H_2SO_4$).<br>▪ Wet Oxidation @ 1000°C for 9 hrs. The vertical increase in step height is around 0.65 μm, whereas the lateral expansion is around 0.45 μm. This oxidized polysilicon acts as a mask for $n^+$ implantation, and thereby defines the channel length. |
| 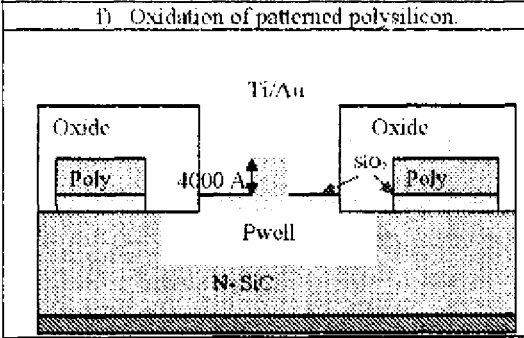<br>g) $n^+$ block lithography and liftoff. | ▪ Liftoff lithography using Mask # 4 ($n^+$ block mask).<br>▪ Deposition of Ti/Au (100/4000A) and liftoff. The Ti/Au blocks the area where we will have $p^+$ implantation later. |

| | |
|---|---|
| 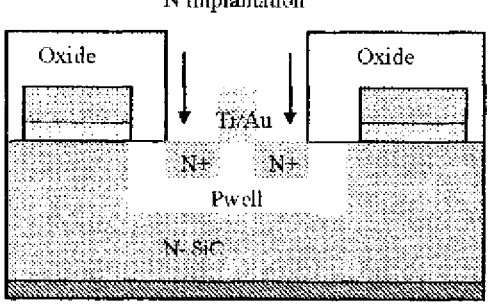<br>b) Source implantation. | ■ Source (nitrogen) implantation:<br>(energy, dose) = (30 keV, $7\times10^{14}$ cm$^{-2}$), (70 keV, $1\times10^{15}$ cm$^{-2}$), (120 keV, $1.6\times10^{15}$ cm$^{-2}$)<br>Implant temperature = 650° C. |
| 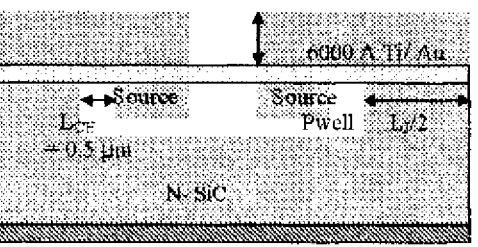<br>i) P$^+$ lithography and liftoff. | ■ Removal of Ti/Au using aqua regia (3 HCl:1 HNO$_3$) and piranha.<br>■ Removal of oxide and polysilicon using BHF and poly-etchant (DI: HF: HNO$_3$) respectively.<br>■ Ebeam evaporation of 200 A of oxide<br>■ Liftoff lithography using Mask # 5 (p+ implant mask).<br>■ Ebeam evaporation of Ti/Au (100A/6000A) and liftoff. |
| 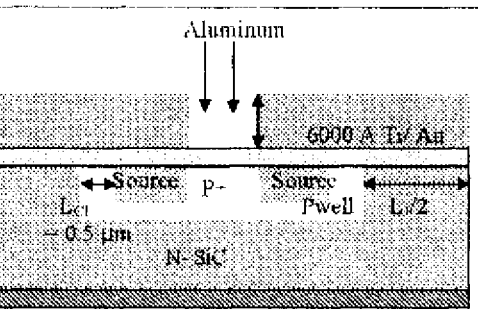<br>j) P$^+$ implantation. | ■ P+ (aluminum) implantation :<br>(dose, energy) = (40 keV, $1\times10^{14}$ cm$^{-2}$), (100 keV, $2\times10^{14}$ cm$^{-2}$), (180 keV, $2.5\times10^{14}$ cm$^{-2}$), (280 keV, $5\times10^{14}$ cm$^{-2}$)<br>Implant temperature = 650° C. |

| | |
|---|---|
| 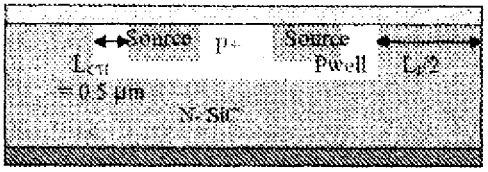<br>k) Wafer cross-section after all implantation and anneal | ■ Removal of Ti/Au layer by aqua-regia.<br>• Deposit PR and graphetize to form implant cap layer.<br>■ Implant anneal @ 1600°C for 40 min in silane (SiH$_4$) ambient.<br>■ Post-implant anneal cleaning. |
| l) Etch isolation trench. | • E-beam evaporation of Ni and liftoff.<br>• RIE isolation trench in SF$_6$.<br>• Remove Ni etch mask using piranha. |
| 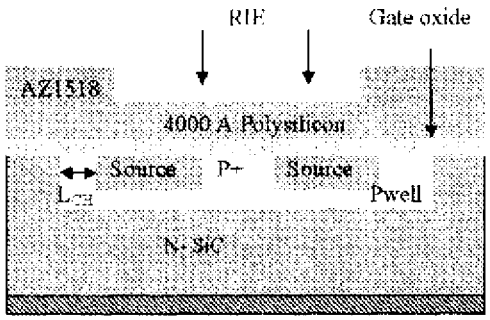<br>m) Patterning of polysilicon gate. | ■ RCA cleaning.<br>■ Gate oxidation (pyrogenic oxidation @1150°C for 150 min).<br>■ NO anneal (for 2 hr. at 1175°C).<br>■ Deposition of 4000 Å polysilicon @ 600°C.<br>■ Spin-on dopant (phosphorous) and drive-in at 900°C.<br>■ Etching lithography using Mask # 7 (gate mask).<br>■ RIE of polysilicon @ 30 W using SF$_6$ @ 10 sccm to pattern the polysilicon. |

| | |
|---|---|
| 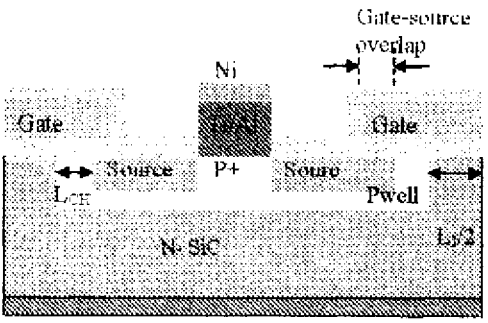 n) P⁺ contact lithography and liftoff. | • Oxidize polysilicon gate.<br>■ Liftoff lithography using mask # 8 (pcontact mask).<br>■ RIE at 100 W for 1 min.<br>■ Barrel etch at 100 W for 1 min.<br>■ BHF dip for 20 s.<br>■ Ebeam evaporation of Ti/Al/Ni (100A/500A/200A) and liftoff. |
| 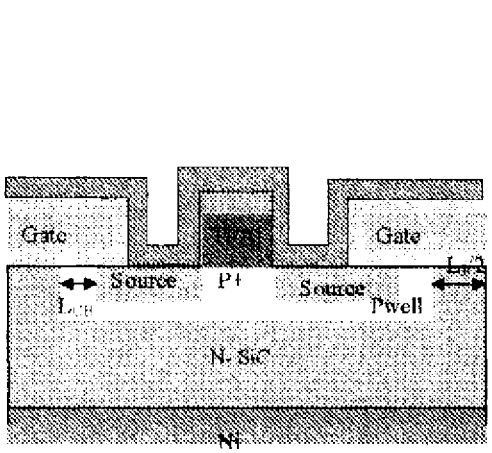 o) N+ contact lithography and liftoff | ■ Liftoff lithography using Mask # 9 (ncontact mask).<br>■ RIE at 100 W for 1 min<br>■ Barrel etch at 100 W for 1 min.<br>■ BHF dip for 20 s.<br>■ Ebeam evaporation of 500 A Ni and liftoff.<br>■ Ebeam evaporation of 2000 A Ni on the backside (drain contact).<br>■ Contact anneal @ 900°C for 2 min. in vacuum. |
| 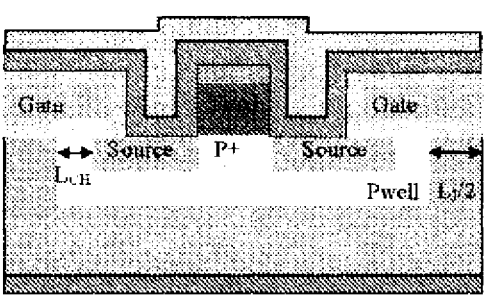 p) Final device cross-section after top metal deposition. | ■ Liftoff lithography using mask # 9 (ncontact mask).<br>■ Ebeam evaporation Ti/Au (150A/7000A) and liftoff |

APPENDIX II:
PROCESS RUN SHEET FOR OPTIMIZED DMOSFET WITH SELF-ALIGNED SOURCE CONTACTS

1. Initial Wafer Clean:
(i) Solvent Clean:
a. Soak in Acetone: 5 min. using ultrasonic cleaner (USC).
b. Soak in Methanol: 5 min. using USC.
c. Soak in Acetone: 5 min. using USC.
d. Soak in Methanol: 5 min. using USC.
e. DI rinse and N2 blow dry.
(ii) Acid Clean:
a. Aqua regia (3HCL: 1 HNO3): 30 min.
b. DI rinse : 6 times.
c. Piranha (1H2O2: 1H2SO4): 15 min.
d. DI rinse : 6 times.
e. BHF dip: 5 min.
f. DI rinse : 6 times.

2. Oxidation and Poly-deposition:
a. Wet oxidation at 900 C for 90 min. in tube 7.
b. Deposition of polysilicon at 575 C for 5.5 hrs at pressure of 160 mtorr , required thickness = 1.5 µm.(Test run is needed right before the actual run to determine the deposition rate).
c. Wet oxidation at 900 C for 30 min. in tube 7.

3. Pwell Lithography and liftoff:
a. Solvent clean (5 min. acetone + 5 min. methanol).
b. Barrel etch for 5 min. in 300 W.
c. Spin COPMMA EL9 @ 2500 rpm for 40 s; bake on hot plate at 200 C for 3 min.; Spin PMMA A2 @ 2500 rpm for 40 s; bake on hot plate at 200 C for 2 min.
d. Ebeam writing for pwell: filament current is 73nA, dose is 900 µC/cm2,VRU4.
e. Develop with MIBK : IPA (1:2.5) for 15 s, rinse in IPA for 1 min.
f. Barrel etch at 100 W for 2 min.
g. Evaporate Ti (150 A) / Ni (2000 A) with 1 A/s rate.
h. Soak in methylene chloride (CH2Cl2) for 6 hrs, use very light methanol spray for proper liftoff of 4 µm x 4 µm ebeam alignment marks. After liftoff, soak in methanol, then rinse in DI water.

4. Micro-masking lithography:
a. Solvent clean (5 min. acetone + 5 min. methanol).
b. Hard bake at 120 C (in oven) for 20 min., cool down properly.
c. Apply AZ4620 at 5000 rpm for 40 s.
d. Softbake at 90 C (in oven) for 5 min., cool down properly.
e. Micro-masking Lithography, exposure time 12 s for UV power 23W/cm2.
f. Develop in (1 AZ 351: 3 DI ) for 50 s, rinse in DI water for 1 min.
g. Hardbake at 120 C (in oven) for 13 min.

5. RIE of Polysilicon :
RIE polysilicon at 100 W, 400 V using SF6 with flow rate of 10 sccm. It was done in 5 + 5 + 3 + 3 + 2 + 1.. min. steps, it takes 17-18 min. to etch through 1.5 µm polysilicon. In the last phase of the etching process, the color of thin polysilicon layer becomes prominent. One can see pink, then green, then blue/white color at this phase. It nearly takes 1-1.5 min. to clean the residual polysilicon layer after you see the blue/white color. SiC/SiO2 has a very smooth texture compared to much rough polysilicon.

6. Registration mark lithography and RIE:
a. Solvent clean (5 min. acetone + 5 min. methanol).
b. Hard bake at 120 C (in oven) for 15 min., cool down properly.
c. Apply HMDS 5000 rpm for 30 s;AZ4620 at 5000 rpm for 40 s.
d. Softbake at 90 C (in oven) for 5 min., cool down properly.
e. Registration mark Lithography, exposure time 12 s for UV power 23 W/cm2.
f. Develop in (1 AZ 351: 3 DI) for 40 s., rinse in DI water for 2 min.
g. Hardbake at 120 C (in oven) for 10 min.
h. 10 min RIE at 100 W, 400 V, using SF6 at 20 sccm, it etch nearly 0.5 μm SiC.
i. Soak in acetone for 1 hr.
j. Barrel etch for 5 min. at 150 W to remove residual resist (AZ 4620).

7. Pwell implantation:
Send wafer to Kroko for pwell (aluminum) implantation at 650 C, 0 degree, [Dose,Energy] = [(2e12, 60 keV), (4e12, 100 keV), (2.2e13, 260 keV), (6.3e13, 330keV)] and counter doping (nitrogen) [Dose, Energy] = [(6e12(for #5)/7e12(for #6), 30 keV)].

8. Oxidation of polysilicon and channel length measurement:
a. Strip off Ti/Ni by soaking in piranha for 5 min. Rinse in DI.
b. Measure the width of the patterned polysilicon features (by SEM) as well as step height (by AlphaStep).
c. Piranha clean for 5 min. Rinse in DI.
d. Wet oxidation at 1000 C for 9 hrs in tube 7.
e. Measure the step height by AlphaStep, the change in height is about 0.75 μm. (Piranha clean is must before any oxidation).
f. Measure the width of oxidized polysilicon layer after oxidation, calculate channel length.

9. N+ block lithography and liftoff:
a. Solvent clean ( 5 min. acetone + 5 min. methanol).
b. Hard bake at 120 C (in oven) for 20 min., cool down properly.
c. Apply HMDS 5000 rpm for 30s,AZ1518 at 4000 rpm for 40 s.
d. Softbake at 90 C (in oven) for 15 min., cool down properly.
e. N+ block Lithography, exposure time 7s for UV power 23 W/cm2
f. Soak in chlorobenzene for 9 min.
g. Develop in (1 AZ 351: 4 DI) for 30 s, rinse in DI water for 2 min.
h. Evaporate Ti (150 A)/ Au (4500 A).
g. Soak in Acetone overnight, use light acetone spray for liftoff.
h. DI rinse

10. N+ source implantation:
a. Send the wafer to Kroko for source (nitrogen) implantation at 650 C, 0 degree,[Dose, Energy] = [(2.5e14, 30 keV), (2.7e14, 70 keV), (4e14, 120 keV)

11. P+ implantation lithography:
a. Remove Ti/Au using aqua regia + piranha.
b. Solvent clean (5 min. acetone + 5 min. methanol)
c. Hard bake at 120 C (in oven) for 20 min., cool down properly.
d. Apply HMDS 5000 rpm for 30 s,AZ1518 at 4000 rpm for 40 s.

e. Softbake at 90 C (in oven) for 15 min., cool down properly.
f. N+ block Lithography, exposure time 7 s for UV power 23 W/cm2
g. Soak in chlorobenzene for 9 min.
h. Develop in (1 AZ 351: 4 DI) for 30 s, rinse in DI water for 2 min.
i. Evaporate Ti (150 A)/ Au (4500 A).
j. Soak in Acetone overnight, use light acetone spray for liftoff.
k. DI rinse

12. P+ implantation:
a. Send the wafer to Kroko for p+ (aluminum) implantation at 650 C, 0 degree,[Dose, Energy] = [(1e14, 40 keV), (2e14, 100 keV), (2.4e14, 170 keV).

13. Implant Anneal:
a. Remove Ti/Au using aqua regia + piranha.
b. BHF for 30 min.
c. HF:H2O:HNO3=1:1:7  5 min ; DI rinse
d. BHF 20min DI rinse; Piranha 15 min, DI rinse
e. make graphite cap
Apply AZ 1518 @ 2500 rpm 15 s; 3 times; Hard bake@120 C 20 min(in oven);Apply AZ1518 @ 2500 rpm 15 s ; twice; Hard bake @120 C 20 min (in oven) Ar 600C 20 min
f. Implant anneal at 1600 C for 40 min. in SiH4/Ar ambient.
g. remove graphite cap
900 C 1 hr dry oxidation in tube 7
h. Post implant cleaning :
Aqua Regia: 30 min.
HF + HNO3: 15 min.
Piranha: 15 min.
BHF: 5 min.
Sacrifice oxidation; 1150C dry oxidation 2 hrs in tube 7

14. Trench Etch:
a. Solvent clean (5 min. acetone + 5 min. methanol).
b. Hard bake at 120 C (in oven) for 20 min., cool down properly.
c. Apply AZ1518 at 4000 rpm for 40 s.
d. Softbake at 90 C (in oven) for 15 min., cool down properly.
e. Trench etch (optical) Lithography, exposure time 7 s for UV power 23 W/cm2
f. Soak in chlorobenzene for 9 min.
g. Develop in (1 AZ 351: 4 DI) for 30 s, rinse in DI water for 2 min.
h. Evaporate Ti (150 A)/ Ni (2000 A).
i. Soak in acetone for 4 hrs, use acetone spray for liftoff. DI rinse.
j. Solvent clean ( 5 min. acetone + 5 min. methanol).
k. Hard bake at 120 C (in oven) for 20 min., cool down properly.
l. Apply AZ4620 at 5000 rpm for 40 s.
m. Softbake at 90 C (in oven) for 5 min., cool down properly.
n. Micro-masking lithography for trench etch , exposure time 12.5 s for UV power 23 W/cm2.
o. Develop in (1 AZ 351: 3 DI ) for 30 s, rinse in DI water for 2 min.
p. Hardbake at 120 C (in oven) for 11 min.
q. 25 min +15 min + 15 min RIE at 100 W, 400 V, using SF6 at 20 sccm, it etched nearly 2.5 μm SiC.
r. Soak in acetone for 1 hr.
s. Barrel etch for 5 min. at 150 W to remove residual resist (AZ 4620).
t. Soak in Piranha for 5 min. to remove Ti/Ni.

u. BHF dip for 5 min to remove oxide layer.

15. Gate Oxidation and NO anneal:
a. RCA clean (right before gate oxidation).
b. Gate oxidation at 1150 C for 2.5 hrs followed by Argon anneals (30 min. at 1150 C, then another 30 min. at 950 C) and re-oxidation anneal at 950 C for 2 hrs.
c. Piranha clean for 5 min.
d. NO anneal at 1175 C for 2 hrs.
e. Piranha clean for 5 min.
f. 5000 A Polysilicon deposition at 575 C 160 mtorr.
g. Apply phosphorous spin on dopant at 5000 rpm for 20 s; Hard bake at 200 C.
h. Drive-in at 900 C for 1 hr.
i. BHF dip for 5 min.
j. Four probe measurement to measure the resistivity of polysilicon.
k. Piranha clean for 5 min, BHF dip for 30 s
l. 5000 A Polysilicon deposition at 575 C 160 mtorr
m. Apply phosphorous spin on dopant at 5000 rpm for 20 s; Hard bake at 200 C
n. Drive-in at 900 C for 1 hr
o. BHF dip for 5 min.
p. Four probe measurement to measure the resistivity of polysilicon
q. Dry oxidation for 20 min. at 1000 C in tube 7.

16. Gate Patterning(ebeam/optical):
Ebeam for Samples 1, 2, and 3
a. Solvent clean (5 min. acetone + 5 min. methanol).
b. Barrel etch for 5 min. in 300 W.
c. Spin COPMMA EL9 @2 500 rpm for 40 s; bake on hot plate at 200 C for 3 min.; Spin PMMA A2 @ 2500 rpm for 40 s; bake on hot plate at 200 C for 2 min.
d. Ebeam writing for gate fingers: 30 nA writing current, VRU4.
e. Develop with MIBK : IPA (1:3) for 30 s (do in 10 s steps), rinse in IPA for 1 min. after each developing step.
f. Barrel etches for 2 min in 100W
f. Evaporate Ti (200 A) / Ni (1550 A).
g. Soak in CH2Cl2 for 1 hr. for liftoff. Use methanol squat bottle for liftoff. Rinse in DI water.
Optical for Samples 4, 5, and 6
a. Solvent clean (5 min. acetone + 5 min. methanol)
b. Hard bake at 120 C (in oven) for 20 min., cool down properly.
c. Apply HMDS 5000 rpm for 30 s, AZ1518 at 4000 rpm for 40 s.
d. Softbake at 90 C (in oven) for 15 min., cool down properly.
e. Gate patterning (optical) Lithography, exposure time 7 s for UV power 23 W/cm2
f. Soak in chlorobenzene for 9 min.
g. Develop in (1 AZ 351: 4 DI) for 30 s, rinse in DI water for 2 min.
h. 1 min. Barrel etch at 100 W for 1 min.
i. Evaporate Ti (200 A) / Ni (1550 A).
j. Soak in Acetone overnight for liftoff. Use methanol squat bottle for liftoff. Rinse in DI water.
Pattern gate polysilicon
a. RIE at 100 W, 400 V at SF6 flow rate of 10 sccm to pattern gate polysilicon.
b. Soak in Piranha for 5 min. to remove Ti//Ni layer.
c. Measure polysilicon thickness
d. Dry oxidation for 6hrs. at 1000 C in tube 7, then wet oxidation for 4.5 hrs at 950 C and then dry oxidation for 2 hrs at 950 C e. Measure increase in height, it is about 0.52 µm – 0.54 µm.
f. Solvent clean (5 min. acetone + 5 min. methanol).
g. Hard bake at 120 C (in oven) for 20 min., cool down properly.
h. Apply AZ1518 at 2000 rpm for 40 s.
i. Softbake at 90 C (in oven) for 15 min., cool down properly.
j. Gate pad Lithography, exposure time 7 s for UV power 23W/cm2. Develop in (1 AZ 351: 4 DI) for 30 s, rinse in DI water for 2 min.
k. Hardbake at 120 C (in oven) for 20 min.
l. RIE at 100 W,400 V at SF6 flow rate of 10 sccm to open gate pad.
j. Dip in BHF for 30 s holding the wafer by tweezers.
k. Rinse in DI water properly.
l. I-V probe test to make sure the oxide layer from gate pad region is fully removed.

17. P+ Contact:
a. Solvent clean (5 min. acetone + 5 min. methanol)
b. Hard bake at 120 C (in oven) for 20 min., cool down properly.
c. Apply HMDS 5000 rpm for 30 s, AZ1518 at 4000 rpm for 40 s.
d. Softbake at 90 C (in oven) for 15 min., cool down properly.
e. P+ contact Lithography, exposure time 7 s for UV power 23 W/cm2
f. Soak in chlorobenzene for 9 min.
g. Develop in (1 AZ 351: 4 DI) for 30 s, rinse in DI water for 2 min.
h. 1 min. Barrel etch at 100 W for 1 min.
i. RIE 100 W, 400 V at SF6 flow rate of 10 sccm 1.35 min
j. 1 min. Barrel etch at 100 W for 1 min.
k. BHF dip for 5 s (holding the wafer with tweezers). Rinse in DI.
l. Evaporate Ti (333 A)/Al(1667 A)/Ni (1000 A). (Load the wafer in the evaporation chamber right after BHF dip).
m. Soak in Acetone overnight for liftoff. Use methanol squat bottle for liftoff. Rinse in DI water.

18. Source Contact:
a. Solvent clean (5 min. acetone + 5 min. methanol)
b. Hard bake at 120 C (in oven) for 20 min., cool down properly.
c. Apply HMDS 5000 rpm for 30 s, AZ1518 at 4000 rpm for 40 s.
d. Softbake at 90 C (in oven) for 15 min., cool down properly.
e. Source contact Lithography, exposure time 7 s for UV power 23 W/cm2
f. Soak in chlorobenzene for 9 min.
g. Develop in (1 AZ 351: 4 DI) for 30 s, rinse in DI water for 2 min.
h. 1 min. Barrel etch at 100 W for 1 min.
i. RIE 100 W, 400 V, 1.35 min
h. 1 min. Barrel etch at 100 W for 1 min.
i. BHF dip for 10 s (holding the wafer with tweezers). Rinse in DI.
h. Evaporate Ni (1000 A). (Load in the evaporation chamber right after BHF dip).
i. Soak in Acetone overnight for liftoff. Use methanol squat bottle for liftoff. Rinse in DI water.

19. Drain Contact:
a. Apply AZ1518 on the front side of the wafer.
b. Hard bake for 20 min. Cool down properly.
c. Etch backside polysilicon by wet etch and oxide layer by BHF dip (holding the wafer with tweezers).
d. Deposit Ni (2000 A) on the backside of the wafer.
e. Remove photoresist by soaking the wafer in acetone. Soak in methanol. DI rinse.

f. Measure devices.

20. Contact Anneal:
a. Soak in acetone for 2 hrs, soak in methanol for 2 hrs.
b. Contact anneal at 900 C for 2 min. in vacuum.
c. Barrel etch for 5 min. at 100 W.
d. Measure Devices.

21. Top Metal:
a. Solvent clean (5 min. acetone + 5 min. methanol)
b. Hard bake at 120 C (in oven) for 20 min., cool down properly.
c. Apply HMDS 5000 rpm for 30 s, AZ1518 at 4000 rpm for 40 s.
d. Softbake at 90 C (in oven) for 15 min., cool down properly.
e. Top metal Lithography, exposure time 7 s for UV power 23 W/cm2
f. Soak in chlorobenzene for 9 min.
g. Develop in (1 AZ 351: 4 DI) for 30 s, rinse in DI water for 2 min.
h. 1 min. Barrel etch at 100 W for 1 min.
i. BHF dip for 10 s (holding the wafer with tweezers). Rinse in DI.
j. Evaporate Ti (200 A)/ Au (7500 A). (Load in the evaporation chamber right after BHF dip).
k. Soak in Acetone overnight for liftoff. Use acetone spray for liftoff. Rinse in DI water.
h. Measure Devices. !!! DONE!!!